(12) United States Patent
Yokota et al.

(10) Patent No.: US 7,972,441 B2
(45) Date of Patent: Jul. 5, 2011

(54) THERMAL OXIDATION OF SILICON USING OZONE

(75) Inventors: Yoshitaka Yokota, San Jose, CA (US); Sundar Ramamurthy, Fremont, CA (US); Vedapuram Achutharaman, San Jose, CA (US); Cory Czarnik, Mountain View, CA (US); Mehran Behdjat, San Jose, CA (US); Christopher Olsen, Fremont, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 11/099,082

(22) Filed: Apr. 5, 2005

(65) Prior Publication Data

US 2006/0223315 A1    Oct. 5, 2006

(51) Int. Cl.
  *C23C 16/40* (2006.01)
  *H01L 21/31* (2006.01)

(52) U.S. Cl. ........ 118/715; 118/724; 118/725; 219/390; 219/405; 219/411; 392/416; 438/769; 438/770

(58) Field of Classification Search .......... 118/715, 118/724, 725; 291/390, 405, 411; 392/416; 219/390, 405, 411; 438/769, 770
See application file for complete search history.

(56) References Cited

U.S. PATENT DOCUMENTS

| | | | | | |
|---|---|---|---|---|---|
| 4,252,623 | A | * | 2/1981 | Vaseen | 204/157.41 |
| 4,341,592 | A | * | 7/1982 | Shortes et al. | 134/2 |
| 4,343,772 | A | * | 8/1982 | Frosch et al. | 422/200 |
| 4,812,201 | A | * | 3/1989 | Sakai et al. | 438/725 |
| 5,551,985 | A | * | 9/1996 | Brors et al. | 118/725 |
| 5,693,578 | A | * | 12/1997 | Nakanishi et al. | 438/770 |
| 5,738,909 | A |   | 4/1998 | Thakur et al. | 427/255.4 |
| 5,785,824 | A | * | 7/1998 | Kitayama et al. | 204/176 |
| 5,879,641 | A | * | 3/1999 | Conrad et al. | 422/186.07 |
| 6,015,591 | A | * | 1/2000 | Li et al. | 427/255.23 |
| 6,037,273 | A | * | 3/2000 | Gronet et al. | 438/773 |
| 6,287,635 | B1 | * | 9/2001 | Cook et al. | 427/255.18 |
| 6,303,522 | B1 |   | 10/2001 | Mertens et al. | 438/774 |
| 6,376,804 | B1 | * | 4/2002 | Ranish et al. | 219/390 |
| 6,435,816 | B1 | * | 8/2002 | Czachor | 415/116 |
| 6,490,146 | B2 | * | 12/2002 | Wang et al. | 361/234 |
| 6,624,091 | B2 | * | 9/2003 | Yuan | 438/778 |
| 6,833,052 | B2 | * | 12/2004 | Li et al. | 156/345.48 |
| 6,833,322 | B2 | * | 12/2004 | Anderson et al. | 438/680 |
| 6,858,153 | B2 | * | 2/2005 | Bjorkman et al. | 216/72 |
| 7,018,941 | B2 | * | 3/2006 | Cui et al. | 438/778 |
| 2001/0047764 | A1 | * | 12/2001 | Cook et al. | 118/730 |
| 2003/0049372 | A1 | * | 3/2003 | Cook et al. | 427/248.1 |
| 2003/0111438 | A1 | * | 6/2003 | Mukai et al. | 216/2 |
| 2003/0170389 | A1 | * | 9/2003 | Sandhu | 427/255.28 |
| 2004/0084144 | A1 | * | 5/2004 | Yokouchi et al. | 156/345.11 |
| 2004/0129224 | A1 | * | 7/2004 | Yamazaki | 118/724 |
| 2005/0092249 | A1 | * | 5/2005 | Kilpela et al. | 118/715 |
| 2006/0162658 | A1 | * | 7/2006 | Weidman | 118/715 |

* cited by examiner

*Primary Examiner* — Ram N Kackar
*Assistant Examiner* — Satish Chandra
(74) *Attorney, Agent, or Firm* — Charles S. Guenzer

(57) ABSTRACT

A method and apparatus for oxidizing materials used in semiconductor integrated circuits, for example, for oxidizing silicon to form a dielectric gate. An ozonator is capable of producing a stream of least 70% ozone. The ozone passes into an RTP chamber through a water-cooled injector projecting into the chamber. Other gases such as hydrogen to increase oxidation rate, diluent gas such as nitrogen or $O_2$, enter the chamber through another inlet. The chamber is maintained at a low pressure below 20 Torr and the substrate is advantageously maintained at a temperature less than 800° C. Alternatively, the oxidation may be performed in an LPCVD chamber including a pedestal heater and a showerhead gas injector in opposition to the pedestal.

7 Claims, 3 Drawing Sheets

THERMAL OXIDATION OF SILICON USING OZONE

FIELD OF THE INVENTION

The invention relates generally to fabrication of integrated circuits. In particular, the invention relates to thermal oxidation of and other oxygen-based treatment of electronic materials such as silicon.

BACKGROUND ART

The fabrication of silicon integrated circuits typically includes one or more steps of forming layers of silicon dioxide, having a general composition of $SiO_2$, although some variation in its stoichiometry is possible. In some applications, dopants are added. For brevity, this material may hereafter be referred to as oxide. Silicon dioxide is a rugged material that bonds well with silicon and is electrically insulating, that is, dielectric. Thicker layers of oxide are typically deposited by spin-on glasses or by chemical vapor deposition, particularly when they form inter-level dielectric layers, which may be formed over metal and other oxide features. However, thin oxide layers formed over silicon may be formed by oxidizing the silicon to form silicon oxide. The silicon to be oxidized may be monocrystalline silicon of the wafer or polysilicon deposited as a layer on the wafer in a multi-level structure. Gate oxide layers may be formed by oxidation of typically about 1 nm or less. Pads and STI (shallow trench isolation) liners may similarly be formed to thicknesses of typically 5 to 10 nm. The oxide layer not only electrically insulates the underlying silicon but also passivates the silicon/dielectric interface.

Oxidation is conventionally performed by heating the silicon surface to approximately 1000° C. to 1200° C. or higher and exposing it to gaseous oxygen for dry oxidation or to steam ($H_2O$) for wet oxidation. Such thermal oxidation may conventionally be performed in a furnace accommodating large number of wafers, but furnaces have in part been superseded by single-wafer processing chambers utilizing a process called rapid thermal oxidation (RTO), a form of rapid thermal processing (RTP). In RTO, high-intensity incandescent lamps rapidly heat a silicon wafer to very high temperatures and oxygen is flowed into the RTP chamber to react on the surface of the hot wafer to react with the silicon and produce a layer of silicon oxide on top of the wafer. Gronet et al. disclose oxidation in an RTP chamber in U.S. Pat. No. 6,037,273, incorporated herein by reference in its entirety. One advantage of RTO is that the walls of the RTP chamber are typically much cooler than the wafer so that oxidation of the chamber walls is reduced. Gronet et al. disclose injecting oxygen and hydrogen gases into the RTP chamber to react near the hot wafer surface for in situ generation of steam.

It has been recognized that oxygen radicals O* provide several advantages in silicon oxidation. The oxygen radicals more easily react than oxygen gas so that the oxidation rate is increased for a given temperature. Further, the radicals promote corner rounding, an important feature in STI.

Oxygen plasmas have been used for oxidation, but they are felt to subject the semiconducting silicon and dielectric layers to damage particularly when the oxygen species is charged, e.g. $O^-$ or $O^=$.

Ozone ($O_3$) is an unstable form of oxygen gas that may be considered an oxygen radical since $O_3$ spontaneously dissociates into $O_2$ and O*, particularly when exposed to surfaces held at temperatures of greater than 400° C. It is known to use ozone in silicon oxidation, see U.S. Pat. No. 5,294,571 to Fujishiro et al. and U.S. Pat. No. 5,693,578 to Nakanishi et al. However, most known prior art for ozone-assisted oxidation occurs at relatively high temperatures and low ozone concentrations.

Another approach for low temperature oxidation supplies the reactor chamber with a gas mixture of oxygen gas $O_2$ and ozone $O_3$, as disclosed in U.S. Pat. No. 5,330,935 to Dobuzinsky et al. (hereafter Dobuzinsky). Ozone is a metastable form of oxygen that may be generated in a microwave or UV generator and which readily dissociates into $O_2$ and the oxygen radical O*. Dobuzinsky supplies the ozone-rich mixture into a thermal reactor operated at a relatively low temperature but including additional RF plasma excitation of the ozone. However, Dobuzinsky's reactor is still a hot-wall reactor so that the ozone quickly dissociates inside the chamber and equally reacts with the chamber walls. Dobuzinsky does however mention the possibility of RTO after their plasma oxidation.

More recent technology has imposed different constraints upon silicon oxidation processes. In view of the very thin layers and shallow doping profiles in advanced integrated circuits, the overall thermal budget and maximum processing temperatures are reduced. That is, the typical oxidation temperatures of greater than 1000° C. are considered excessive even when used with the rapid temperature ramp rates available in RTP. Furthermore, the gate oxide thickness are decreasing to well below 1 nm, for example, 0.3 to 0.6 nm in the near future. However, to prevent dielectric breakdown and increase reliability, the gate oxides must be uniformly thick and of high quality. Plasma oxidation may be a low temperature process because it produces oxygen radicals O* which readily react with silicon at low temperatures. However, charging and other effects on the fragile thin oxide prevent plasma oxidation from being widely adopted. The fabrication of advanced integrated circuits is not only constrained by a reduced thermal budget, they it is also facing decreasing limits in the maximum temperature to which the ICs may be exposed even for short times. The known prior art of ozone oxidation does not satisfy the more recent requirements.

It is felt that the prior art insufficiently utilizes the advantages of ozone for low temperature oxidation without the use of plasmas.

Furthermore, ozone is considered explosive. Safety concerns are greatly alleviated if the pressure within a chamber containing ozone is held at a pressure of no more than 20 Torr. Such low pressures, however, disadvantageously decrease the oxidation rate.

SUMMARY OF THE INVENTION

Silicon or other material in a semiconductor substrate is oxidized by exposing it to a high concentration of ozone at a relatively low temperature, for example, between 400 and 800° C. in a plasma-free process. Even lower temperatures are possible. The processing chamber may be maintained at a relatively low pressure, for example, less than 20 Torr, which low pressure simplifies the safety requirements. The pressure may be even lower, for example, less than 10 Torr or even less than 5 Torr. The invention is particularly useful for growing a gate oxide or a passivation layer on silicon.

The ozone may be produced in an ozonator, which includes several types of apparatus producing ozone from oxygen. The ozonator should be capable of producing a stream of oxygen-containing gas that is at least 30% ozone, more preferably 70% ozone, still more preferably at least 80%, and even more preferably at least 90%.

The ozone may be combined with a diluent gas such as oxygen gas or nitrogen.

The ozone/oxygen mixture may be combined with hydrogen to increase the oxidation rate. The hydrogen may be essentially pure hydrogen gas or be a forming gas of $H_2/N_2$, for example, having 7% hydrogen.

The ozone/oxygen mixture may be combined with a nitriding gas such as nitrous oxide or ammonia so that the oxidation product is a silicon oxynitride.

The oxidation may be performed in a rapid thermal processing (RTP) chamber including an array of incandescent lamps or a scanned laser source to radiantly heat the substrate.

The ozone is preferably introduced into the RTP processing chamber in a first inlet port separate and offset from a second inlet port supplying the diluent gas of oxygen or nitrogen, hydrogen, and nitriding gas. Preferably, the two ports are angularly spaced on the chamber wall with a separation of between 15° and 120°, 90° being a preferred separation. The first inlet port for the ozone preferably includes a cooled injector that projects into the processing chamber and is cooled by water or other cooling fluid.

Alternatively, the oxidation may be performed in a low-pressure chemical vapor deposition (LPCVD) chamber including an electrically heated pedestal supporting and heating the substrate and a showerhead positioned in opposition to the substrate. The showerhead includes a supply manifold in which the ozone/oxygen gas and other gases may be mixed and a large number of apertures between the manifold and the processing chamber over an area approximately covering the substrate.

DESCRIPTION OF THE PREFERRED EMBODIMENTS

The invention in part concerns the thermal oxidation of silicon or other materials in the presence of ozone in an RTP (rapid thermal processing) chamber or in chamber adapted for chemical vapor deposition.

Figure 1:
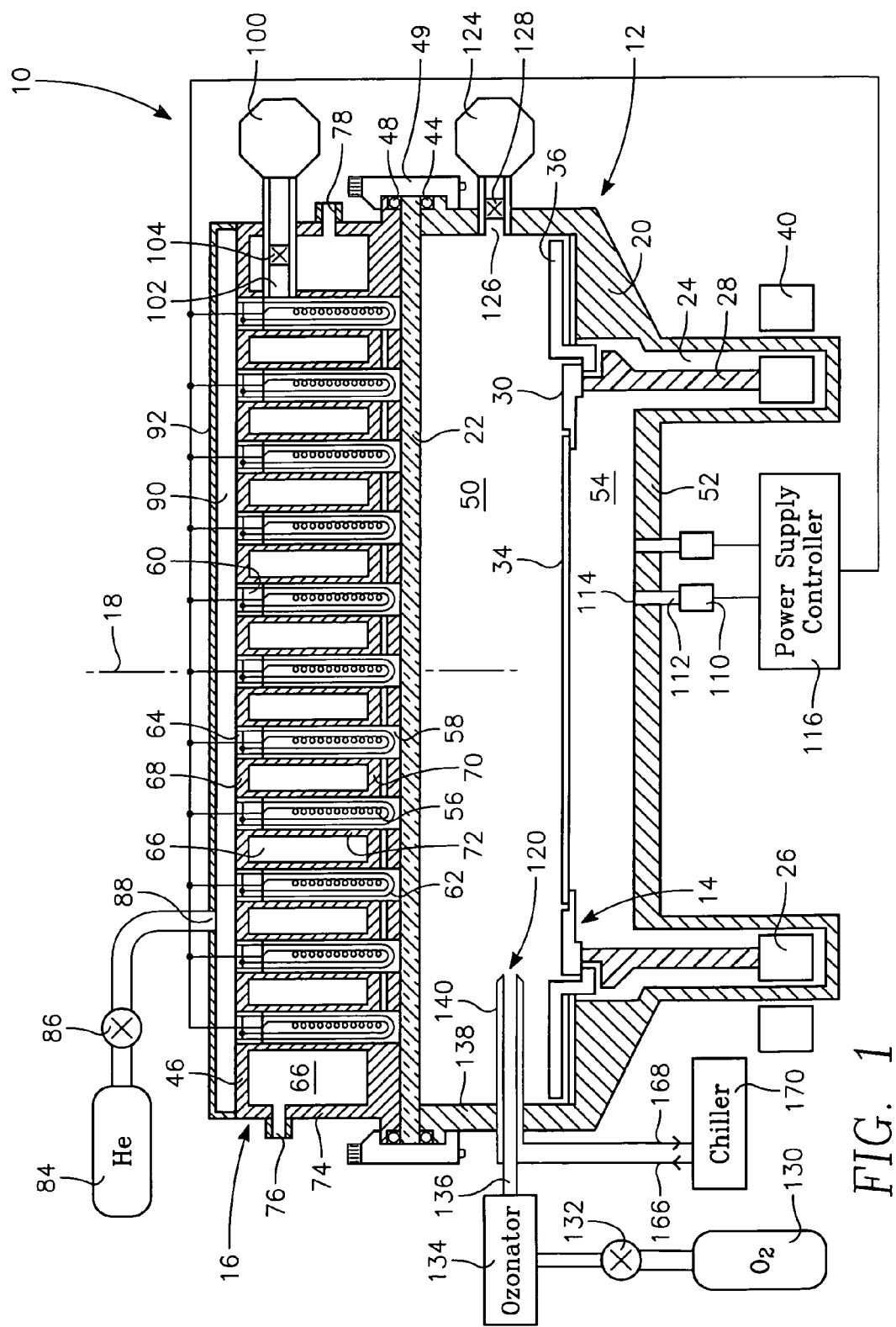
FIG. 1 is a cross-sectional view schematically illustrating a rapid thermal processing (RTP) chamber capable of performing ozone-based thermal oxidation.

FIG. 1 schematically illustrates in cross section an RTP chamber 10 described by Ranish et al. in U.S. Pat. No. 6,376,804, incorporated herein by reference. The chamber 12 is generally representative of the Radiance RTP chamber available from Applied Materials, Inc, of Santa Clara, Calif. The RTP chamber 10 includes a vacuum chamber 12, a wafer support 14 located within the chamber 12, and a lamphead 16 or heat source assembly located on the top of the chamber 12, all generally symmetrically arranged about a central axis 18.

The vacuum chamber 12 includes a chamber body 20 and a window 22 resting on the chamber body 20. The window 22 is composed of a material that is transparent to infrared light, for example, clear fused silica quartz.

The chamber body 20 may be made of stainless steel and be lined with a quartz liner (not shown). An annular channel 24 is formed symmetrically about the central axis 18 near the bottom of the chamber body 20. The wafer support 14 includes a magnetic rotor 26 placed within the channel 24, a quartz tubular riser 28 resting on or otherwise coupled to the magnetic rotor 26, and an edge ring 30 resting on the riser 28. The edge ring 30 may be composed of silicon, silicon-coated silicon carbide, opaque silicon carbide, or graphite. During processing, a wafer 34 or other substrate rests on the edge ring 30 in opposition to the window 22. A purge ring 36 outside and below the edge ring 30 supplies a purge gas such as argon to the back of the wafer 34. A magnetic stator 40 located externally of the magnetic rotor 26 is magnetically coupled through the chamber body 20 to the magnetic rotor 26. The rotor 26 may be mechanically supported on ball bearings or be magnetically levitated by the magnetic rotor 26. When an unillustrated motor rotates the magnetic stator 34 about the central axis 18, it induces rotation of the magnetic rotor 26 and hence of the edge ring 30 and the supported wafer 34 about the central axis 18.

The quartz window 22 rests on an upper edge of the chamber body 20 and an O-ring 44 located between the window 22 and the chamber body 20 provides a vacuum seal between them. A lamphead body 46 of the lamphead 16 rests on the window 20. Another O-ring 48 located between the window 20 and lamphead body 46 provides a vacuum seal between them when a clamp 49 presses together the chamber body 20 and the lamphead body 46 with the window 22 and O-rings 40, 48 sandwiched between them. A vacuum-sealed processing space 50 is thereby formed within the chamber body 20 below the window 22 and encompasses the wafer 34 to be processed. The wafer 34 is transferred into and out of the processing chamber by means of an unillustrated wafer port in the sidewall of the chamber body 20, a slit valve selectively sealing the wafer port, a wafer paddle insertable through the wafer port, and lift pins in a bottom wall 52 of the chamber body 20 which selectively raise the wafer 34 above the edge ring 30 and the paddle. The top surface of the bottom wall 52 may be coated with a reflective layer to act as a reflector plate defining one side of a black body cavity 54 on the backside of the wafer 34.

The lamphead 16 includes a plurality of lamps 56 loosely disposed in respective downwardly directly lamp holes 58. The lamps 56 are supported by and electrically powered through electrical sockets 60. The lamps 56 are preferably incandescent bulbs that emit strongly in the infrared such as tungsten halogen bulb having a tungsten filament inside a quartz bulb 62 filled with a gas containing a halogen gas such as bromine and diluted with an inert gas to clean the inside of the quartz bulb 62. The upper portion of each bulb 62 and its socket 60 are potted into its lamp hole 58 with a ceramic potting compound 64, which is relatively porous. The lamps 56 are located inside the reflective walls of the vertically oriented cylindrical lamp holes 58 within the lamphead body 46 to form respective light pipes. The open ends of the lamp holes 58 of the lamphead body 46 are located adjacent to but separated from the window 20.

Interconnected cooling channels 66 are defined within the lamphead body 40 by upper and lower lamphead chamber walls 68, 70 and cylindrical walls 72 surrounding each of the lamp holes 58 as well as an exterior side wall 74 of the lamphead body 46. A recirculating coolant, such as water, introduced into the chambers 66 via an inlet 76 and removed at an outlet 78 cools the lamphead body 46 and traveling adjacent the lamp holes 58 cools the lamps 56. Baffles may be included to ensure proper flow of the coolant through the cooling channels 66.

A thermally conductive gas, such as helium, is supplied from a pressurized gas source 84 and metered by a mass flow controller 86 to be delivered to the lamphead 16 to facilitate thermal transfer between the lamps 56 and the cooling channels 66. The helium is supplied through a port 88 to a manifold 90 formed in back of the lamp bases between the lamp holes 58 and a lamphead cover 92. Opening the mass flow controller 86 causes the thermal transfer gas to flow into the manifold 90 and further flow through the porous potting compound 64 around the sides of the bulb 62 of each lamp 56 to cool by heat convectively transferred through the thermal transfer gas to the cooling water in the channels 66.

A vacuum pump 100 reduces the pressure within the lamphead body 46, particularly when the processing chamber 50 within the chamber 12 is vacuum pumped so that the reduced pressure in the lamphead body 46 reduces the pressure differential across the quartz window 20. The vacuum pump 100 is connected to the air passages in the lamp holes 58 surrounding the lamps 56 through a port 102 including a valve 104. The pumping of the vacuum pump 100 must be balanced with the supply of helium from the gas source 84 to maintain the desired pressure of helium within the lamphead 16 for promoting thermal transfer.

Thermal sensors such as seven pyrometers 110 (only two of which are shown) are supported by the chamber body 20 and are optically coupled to light pipes 112 disposed in respective apertures 114 in the bottom wall 52. The pyrometers 110 detect respective temperatures or other thermal properties at different radial portion of the lower surface of the wafer 34 or of the edge ring 30, as described in U.S. Pat. No. 5,755,511 to Peuse et al. The pyrometers 110 supply temperature signals to a power supply controller 116, which controls the power supplied to the infrared lamps 56 in response to the measured temperatures. The infrared lamps 56 may be controlled in radially arranged zones, for example, fifteen zones, to provide a more tailored radial thermal profile to compensate for thermal edge effects. All the pyrometers 110 together provide signals indicative of a temperature profile across the wafer 34 to the power supply controller 116, which controls the power supplied to each of the zones of the infrared lamps 56 in response to the measured temperature profile.

The chamber body 20 of the processing chamber 12 includes two perpendicularly arranged processing gas inlet ports 120, 122 (inlet port 122 is not illustrated in FIG. 1). In use, the pressure within the process space 50 can be reduced to a sub-atmospheric pressure prior to introducing a process gas through the gas inlet ports 120, 122. The process space 50 is evacuated by a vacuum pump 124 pumping through a pump port 126 arranged diametrically opposite the first inlet port 120. The pumping is largely controlled by a butterfly valve 128 disposed between the pump port 126 and the vacuum pump 124. The pressure may be reduced to between about 1 and 160 Torr. However, for reasons to be described below, the chamber pressure is preferably maintained at less than 20 Torr.

Although the RTP chamber 10 represents the most prevalent type of RTP chamber in use today, advanced RTP chambers are being developed using one or more lasers whose beams are scanned over the substrate, as has been disclosed by Jennings et al. in U.S. Patent Application Publication US 2003/0196996 A1, incorporated herein by reference in its entirety.

According to one aspect of the invention involving oxidation, a gas source 130 supplies oxygen gas ($O_2$) through a mass flow controller 122 to an ozonator 134, which converts a large fraction of the oxygen to ozone gas ($O_3$). The resultant oxygen-based mixture of $O_2$ and $O_3$ and perhaps some oxygen radicals O* and ionized oxygen atoms or molecules is delivered through a process gas supply line 136 to the first inlet port 120 and into the processing chamber 50, The oxygen-based gas reacts within the processing chamber 50 with the surface of the wafer 34, which has been heated to a predetermined, preferably low temperature by the infrared lamps 56. Ozone is a metastable molecule which spontaneously quickly dissociates in the reaction

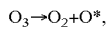

where O* is a radical, which very quickly reacts with whatever available material can be oxidized. In general, ozone dissociates on any surface having a temperature greater than 400° C. although it also dissociates at a lower rate at lower temperatures.

The ozonator 134 may be implemented in a number of forms including a capacitively or inductively coupled plasma or a UV lamp source. It is preferred that the ozonator be capable of a stream of gas containing at least 70% ozone, more preferably at least 80%, and most preferably at least 90%. Even an ozone concentration of at least 30% would provide advantages over the prior art. An ozonator capable of producing the higher ozone concentrations is commercially available from Iwatami International Corp, of Osaka, Japan as Model AP-800-LR. Other ozonators and sources of ozone may be used with the invention.

At these high ozone concentrations, the wafer need not be heated very much to achieve relatively high oxidation rates. The high ozone concentration also allows the ozone partial pressure to be reduced. Safety rules in place in many countries require that special procedures and equipment be implemented whenever ozone is present at pressures of greater than 20 Torr. Below 20 Torr, the strict rules do not apply. Accordingly, a high ozone fraction allows the ozone oxidation to be performed at pressures of less than 20 Torr.

Highly concentrated ozone may be used not only to oxidize bare silicon but may be used in a two-step process. In the first step, a thin oxide is grown perhaps using only oxygen at a relatively low temperature. In the second step, concentrated ozone is used to treat the preexisting oxide film and to increase its thickness to a reliable level. The concentrated ozone may also be used to treat and possibly increase the thickness of a metal oxide film, such as tantalum oxynitride (TaNO). Similarly, high-k dielectric films, for example, of perovskite material, may be treated with concentrated ozone to stabilize them and for other reasons.

One problem with ozone oxidation is that a high temperature, for example, above 400° C., of any surface to which the ozone is exposed promotes the dissociation of ozone before it reaches the hot wafer surface. As a result, the ozone should be maintained relatively cool except adjacent the wafer being oxidized. An RTP chamber is advantageous for ozone oxidation because it may be considered to be a cold-wall reactor in which the chamber walls are typically much cooler than the radiantly heated wafer. In contrast, in a hot-wall reactor such as an annealing furnace, the wafer temperature is no more than the temperature of the surrounding furnace wall or liner. Although high wafer temperatures are achievable in RTP chambers, a sidewall 138 of the processing chamber 50 and the window 22 are typically maintained at much lower temperatures, particularly if the thermal process performed over a relatively short period. Nonetheless, even the walls of an RTP chamber become somewhat warm and any ozone adjacent the warm walls is likely to dissociate far from the wafer and perhaps oxidize the chamber wall rather than the wafer.

To reduce the effect of a warm chamber, the ozone is supplied into the chamber through an injector 140 which projects from the chamber sidewall 138 towards the center 18 of the processing chamber 50 parallel and above the surface of the wafer 34. In one embodiment, the nozzle tip of the injector 140 is radially spaced about 2.5 cm outwardly of the edge of the wafer 34. Furthermore, the injector 140 is preferably water cooled or otherwise temperature controlled by a fluid.

Figure 2:
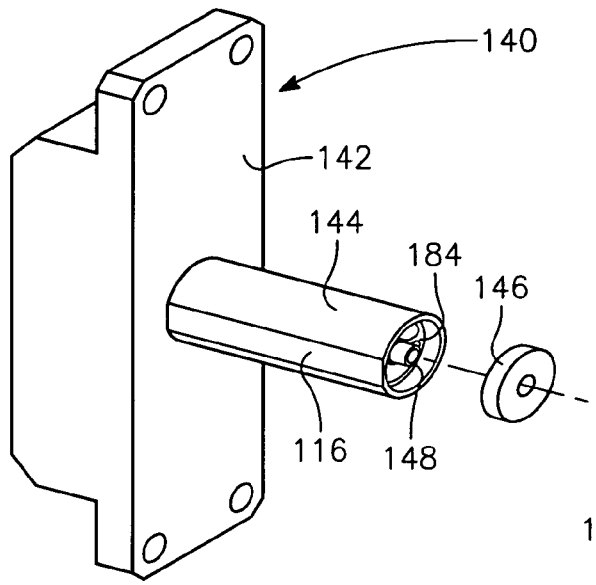
FIG. 2 is an exploded orthographic view of a water-cooled gas injector.
Figure 3:
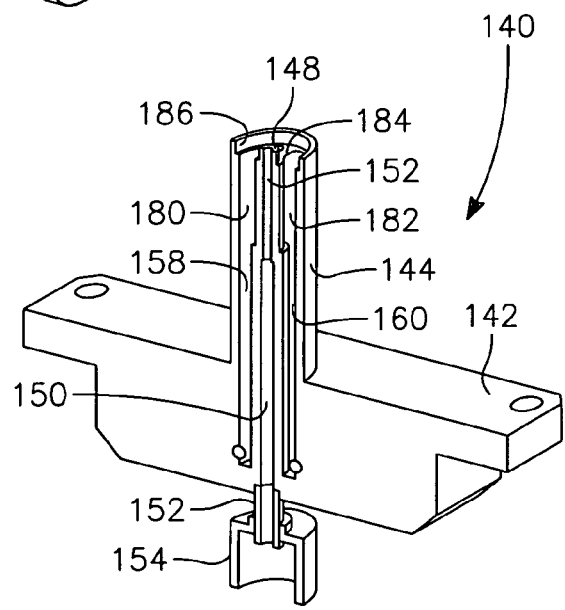
FIG. 3 is a sectioned orthographic view of the injector of FIG. 2.
Figure 4:
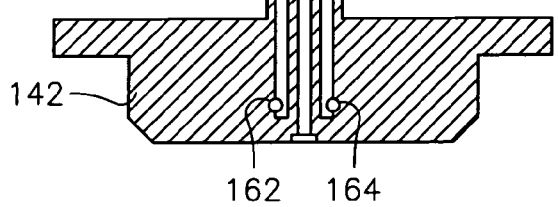
FIG. 4 is a cross-sectional view of the injector of FIG. 2.
Figure 5:
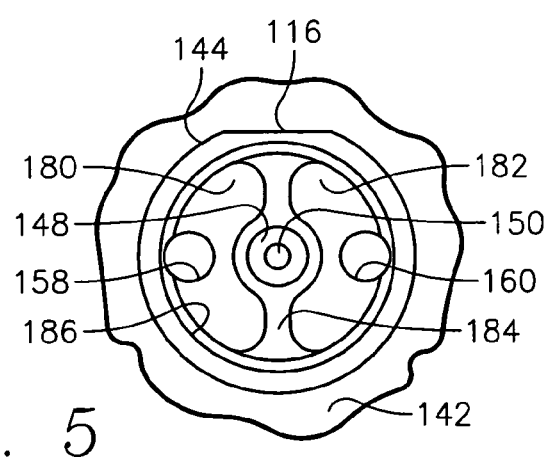
FIG. 5 is an axial plan view of the injector of FIG. 2.

One embodiment of the injector 140 is illustrated in the orthographic view of FIG. 2, the sectioned orthographic view of FIG. 3, and the cross-sectional view of FIG. 4. A base 142 can be screwed to the exterior of the chamber sidewall 138 and sealed to it in a configuration having an tubular body 144 of a length of about 5 cm projecting into the processing chamber 50. A washer 146 is welded to the end of the tubular body 144 to seal the end of the tubular body 144 except for an injector nozzle 148 penetrating through and welded to the hole of the washer 146. A plan view of the tubular body 144 shown in FIG. 5 is taken along line 5-5 of FIG. 4 along the axis of the tubular body 144. For clarity, the views of FIGS. 3, 4, and 5 omit the washer 146.

A central gas line 150 is machined in the tubular body 144 and terminates at the injector nozzle 148 at its distal end. A supply tube 152 is fixed to the base 142 and communicates with the central gas line 150. A gland 154 captures the end of the supply tube 152 and is threaded onto the gas supply line 136 from the ozonator 134 of FIG. 1. Two circular axially extending liquid lines 158, 160 are bored into the tubular body 144 offset from the tube's central axis but stop before reaching the bottom of the base 142. Instead, two obliquely oriented fluid lines 162, 164 are bored from the outside of the base 142 to meet with the axial liquid lines 158, 160 on their inner ends and to be mated with corresponding tubes and glands on their outer ends and thereby be coupled by two recirculating chilling lines 166, 168, illustrated in FIG. 1, to the two ports of a chiller 170. The chiller 170 either supplies cold water or recirculates cooling water or other cooling liquid or fluid refrigerant through the injector 140 to cool it and the injected ozone.

Returning to FIGS. 2-5, two axially extending, arc-shaped apertures 180, 182 are machined in the distal portion of the tubular body 144 to be respectively connected to the two axial liquid lines 158, 160. A septum 184 separates the two arc-shaped apertures 180, 182, and the distal end of the gas line 150 is formed within the septum 184. An annular ledge 186 is machined into the distal end of the tubular body 144 at a level slightly above the end surface of the septum 184. The washer 146 rests on the ledge 186 and is welded to the outer portion of the tubular body 144 and to the injector nozzle 148. Thereby, cooling water supplied by one liquid line 158 flows through one arc-shaped aperture 180 surrounding almost half of the distal portion of the gas supply line 160, flows through the gap between the end surface of the septum 184 and the washer 146 and into the other arc-shaped aperture 182 surrounding most of the other half of the distal portion of the tubular body 144 before flowing out through the other liquid line 160.

The liquid-chilled injector 140 cools the ozone and injects it closer to the wafer 34, thereby decreasing the likelihood of premature dissociation and oxidation of other chamber parts. It also tends to cool the chamber wall 138 in its immediate vicinity.

Figure 6:
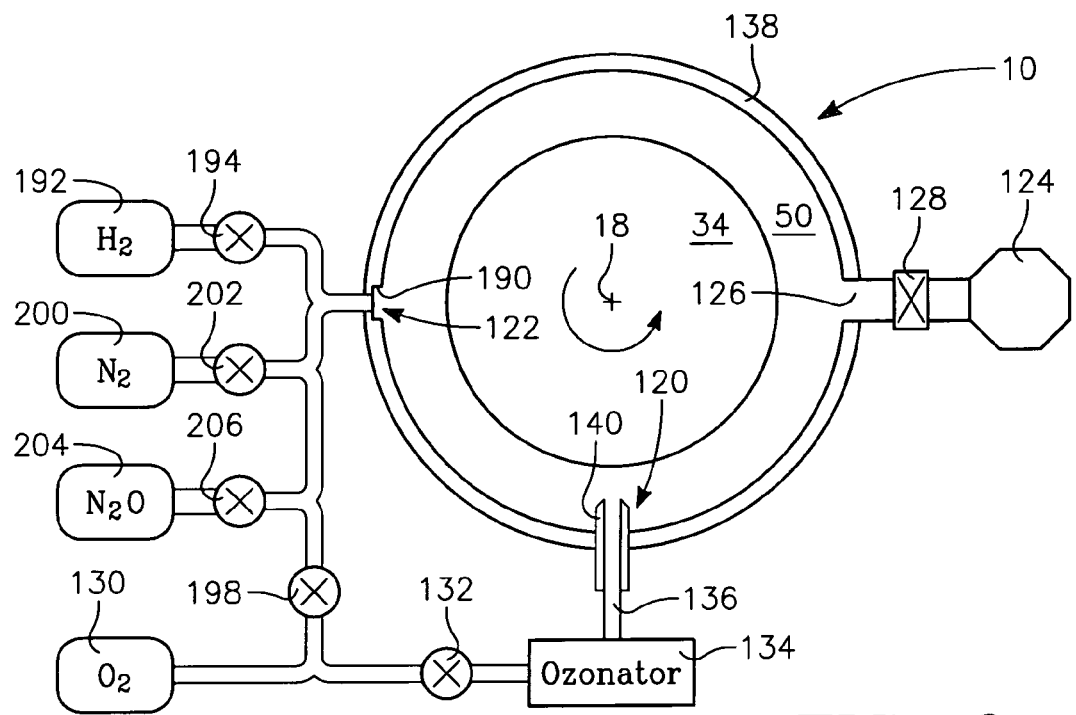
FIG. 6 is a schematic cross-sectional view of the RTP chamber taken along its central axis.

A cross-sectional view of FIG. 6 taken along the chamber axis 18 schematically illustrates the RTP chamber 10 in the vicinity of the processing space 50. The first and second gas inlet ports 120, 122 extend in a plane perpendicular to the central axis 18. The second gas inlet port 122 may be located 90° about the axis 18 within that plane from the first gas inlet port 120 supplying the ozone through the water-chilled injector 140. The angular separation, preferably in the range of 15° and 115°, between the two processing gas inlets 120, 122 delays the mixing of the ozone with the other gases. The injector 140 for the ozone is located downstream from the inlet port 122 for the other gases as referenced to the rotation direction of the wafer 34. The second gas inlet 120 is diametrically disposed from the pump port 126 and placed above the unillustrated wafer port in the chamber wall 138. Diluent, nitriding, and hydrogen gases are supplied through the second gas inlet port 122 so as to reduce any back pressure in the injector 140 and in the gas supply line 136 supplying the ozone to it. The second gas inlet 122 does not require cooling so that it may be conventionally formed of a gas supply line terminating in a recess 190 in the chamber wall 138, thus not interfering with the wafer port or its slit valve.

Gaseous hydrogen from a gas source 192 is metered by a mass flow controller 194 into the processing chamber 50 via the second gas inlet 122 to increase the oxidation rate, if desired in a process similar to in situ steam generation. The hydrogen gas may either be essentially pure hydrogen or be part of a mixture, such as a forming gas having about 7% hydrogen and 93% nitrogen. It has been found that pure hydrogen supplied with the highly concentrated ozone to a fraction of 33% provides the desired high oxidation rate. It is believed that hydrogen increases the concentration of oxygen radicals.

Gaseous oxygen may be supplied from the oxygen gas source 130 through another mass flow controller 198 to the second gas inlet 122 to act as a diluent to reduce the oxidation rate, which may be desired for very thin gate oxides. While it is possible for the ozonator 134 to pass additional gaseous oxygen to the first gas inlet 120, the additional flow would increase the back pressure in the injector 140 and its supply line. An alternative diluent gas is nitrogen supplied from a gas source 200 through a mass flow controller 202 to the second gas inlet 122. The nitrogen is also used to purge the processing chamber 50. Other diluent gases may be used, for example, argon or helium.

Other processing gases may be used. For example, nitrous oxide ($N_2O$) supplied from a gas source 204 through a mass flow controller 206 acts as a nitriding gas. The nitrous oxide may be used when a film of silicon oxynitride is desired as the oxidation product. It may also be supplied separately from the ozone to effect a forming anneal. Gaseous ammonia ($NH_3$) may alternatively be used as the nitriding gas, or other nitriding gases may be substituted.

Although the gas distributions from both the first and second gas inlets 120, 122 are non-uniform across the wafer 34, the wafer 34 is rotating about the axis 18 fast enough to time-average out the non-uniformity.

The RTP chamber illustrated in FIG. 1 is illustrative only. Other RTP chambers may be used with the invention. Other types of thermal processing equipment may be also use. For example, Jennings et al. describe in U.S. Patent Application Publication US 2003/0196996 a thermal processing apparatus that scans a narrow beam of laser light across the surface of the wafer.

High-concentration ozone oxidation has been verified in an RTP chamber. The resultant oxide films have been observed to exhibit many fewer interfacial defects, presumably arising from dangling bonds, than oxide grown with oxygen radicals formed in a steam generator. Ozone oxidation has been observed at wafer temperatures down to 600° C. and reasonable oxidation rates should occur at lower temperatures, for example, down to 400° C. However, 800° C. appears more workable at the present time. Wafer temperatures of 1000° C. produce very low defects densities. It is contemplated that future generations of integrated circuits will require oxidation temperatures even lower than 400° C., perhaps even room temperature. Chamber pressures of between 3 and 5.5 Torr have been used, far below the safety limit of 20 Torr. Even lower pressures may be used. Ozone-based oxidation with 33% hydrogen has been observed to produce a 2 nm oxide thickness for 1 minute of processing. Ozone flow rates need to be maximized to achieve high oxidation rates.

Figure 7:
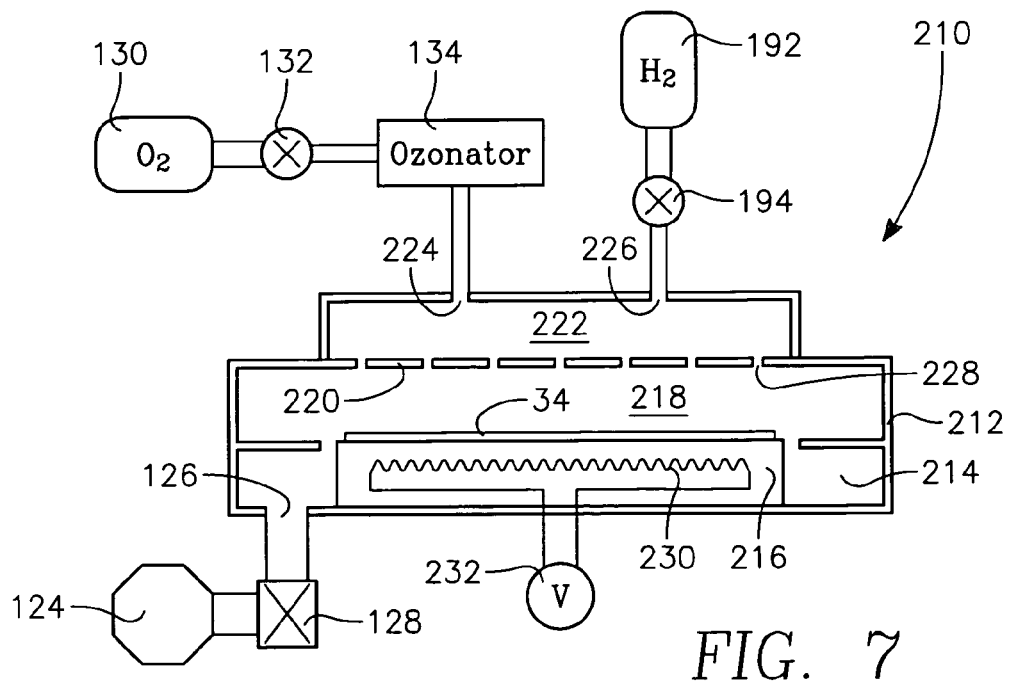
FIG. 7 is a cross-sectional view schematically illustrating a low-pressure chemical vapor deposition (LPCVD) chamber configured for ozone-based thermal oxidation.

The relatively low process temperatures achievable with high-concentration ozone allows the use of a chamber resembling an LPCVD (low pressure chemical vapor deposition) chamber 210, schematically illustrated in cross section in FIG. 7. A vacuum chamber 212 is pumped to, for example, less than 10 Torr by the vacuum pump 124 through the pump port 126 formed in an annular pumping manifold 214 formed near its bottom wall. A pedestal heater 216 is configured to a support the wafer 34 across a processing space 218 in opposition to a showerhead 220 in the upper wall of the chamber 212. A supply gas manifold 222 is formed on top of the chamber 210 to receive the highly concentrated ozone through one gas inlet port 224 and the steam generating gas $H_2$ through a second gas inlet port 216. If required, a diluent gas, such as oxygen or nitrogen or other nitriding gas may also be controllably supplied, either through the second gas inlet port 226 or through separate ones. The gases mix and equilibrate in the gas supply manifold 222 before passing through a large number, typically at least 100, of small apertures 228 formed through the showerhead 220 in an area overlying the wafer 34. The processing space 218 between the showerhead 220 and the wafer 34 may have a thickness of about 500 mils (1.2 cm) in comparison to a wafer diameter of 200 or 300 mm. The pedestal heater 216 includes a resistive heater 230 powered by an electrical power supply 232 to heat the pedestal heater 216 to a relatively low temperature, for example, 400 to 700° C., needed for high-concentration ozone oxidation. Other types of electrical heating are known, such as RF susceptors. The temperatures of the showerhead 220 and the manifold 222 need to be maintained at relatively low levels, for example, less than 400° C. and preferably substantially lower, by for example water cooling to prevent the premature dissociation of the ozone.

The planar geometry made possible in the LPCVD chamber 210 by the narrow processing space 218, the wide showerhead 222, and the annular pumping manifold 214 provides good uniformity for ozone-based oxidation without the need to rotate the pedestal 216. The high-concentration of ozone allows relatively low oxidation temperatures provided by a simple resistively heated pedestal. As a result, the ozone-based oxidation may be performed in a relatively simple and inexpensive chamber and not impose particularly high temperatures on the wafer 34.

Although oxidation of silicon is the most widespread use of the invention, the invention is not so limited and different aspects of the invention can be applied to oxidizing other materials.

The gas injector of the invention is not limited to injecting ozone or other oxidizing gases and may be used with other types of CVD.

The invention claimed is:

1. A substrate oxidizing apparatus, comprising: a vacuum chamber having sidewalls arranged about a central axis; a rotatable support within the vacuum chamber for supporting a substrate in a first plane perpendicular to the central axis and rotating the substrate in an angular direction about the central axis, the substrate having a pre-existing surface layer to be oxidized to form an oxide layer on the substrate and the central axis passing through the substrate;

a heat source capable of heating the substrate to an elevated oxidizing temperature; a source of hydrogen gas conveying the hydrogen gas into the chamber only through a single first gas port in the sidewalls, extending in a second plane perpendicular to the central axis, and directing the hydrogen gas perpendicularly to the central axis and towards a central region of the substrate;

an ozonator receiving a flow of oxygen gas, forming an electrically coupled plasma selected from one of a capacitively coupled plasma and an inductively coupled plasma, and capable of producing an ozone-containing gas, an output of the ozonator conveying ozone of the ozone-containing gas into the vacuum chamber through only a single second gas port in the sidewalls, extending in the second plane, and directing the ozone-containing gas perpendicularly to the central axis and towards the central region of the substrate to oxidize the layer in conjunction with the hydrogen gas; and a pump port in the sidewalls for evacuating the vacuum chamber; wherein the second gas port is angularly displaced in the second plane from the first gas port along a circumference about the central axis by an angular displacement of between 15° and 115° to thereby in conjunction with the rotating support delay reaction of the ozone-containing gas and the hydrogen gas conveyed into the chamber by the first and second gas ports;

wherein said ozonator is capable of producing at least 30% ozone in the ozone-containing gas;

wherein a fluid cooled injector incorporated into the second gas port and extending from the sidewalls along an injector axis perpendicular to the central axis and configured to inject the ozone-containing gas toward the substrate from a distal end of the injector.

2. The oxidizing apparatus of claim 1, wherein the oxidizing temperature is at least 400° C.

3. The apparatus of claim 1 wherein said ozonator is capable of producing at least 50% ozone.

4. The apparatus of claim 3, wherein said ozonator is capable of producing at least 90% ozone.

5. The apparatus of claim 1, wherein the angular displacement is along the angular direction.

6. The apparatus of claim 1, wherein the angular separation is 90°.

7. The apparatus of claim 1, wherein the heat source includes a plurality of incandescent lamps directing radiation toward the substrate parallel to the central axis.

* * * * *